United States Patent

Kraemer

(10) Patent No.: US 8,796,801 B2
(45) Date of Patent: Aug. 5, 2014

(54) ILLUMINABLE GAAS SWITCHING COMPONENT WITH TRANSPARENT HOUSING AND ASSOCIATED MICROWAVE CIRCUIT

(75) Inventor: Wilhelm Kraemer, Bad Reichenhall (DE)

(73) Assignee: Rohde & Schwarz GmbH & Co. KG, München (DE)

( * ) Notice: Subject to any disclaimer, the term of this patent is extended or adjusted under 35 U.S.C. 154(b) by 1359 days.

(21) Appl. No.: 11/578,883

(22) PCT Filed: Apr. 22, 2005

(86) PCT No.: PCT/EP2005/004332
§ 371 (c)(1),
(2), (4) Date: Jul. 25, 2007

(87) PCT Pub. No.: WO2005/114737
PCT Pub. Date: Dec. 1, 2005

(65) Prior Publication Data
US 2008/0266032 A1    Oct. 30, 2008

(30) Foreign Application Priority Data

May 17, 2004 (DE) .......................... 10 2004 024 368

(51) Int. Cl.
*H03H 11/14* (2006.01)
(52) U.S. Cl.
USPC ........... 257/434; 257/414; 257/428; 257/432; 257/433; 257/680; 257/E33.056
(58) Field of Classification Search
USPC .............. 257/116, 80, 81, 82, 443; 333/81 A; 385/93, 94
See application file for complete search history.

(56) References Cited

U.S. PATENT DOCUMENTS

| 4,394,572 A | 7/1983 | Wilber ........................ 250/239 |
| 5,034,800 A | 7/1991 | Marchisi ........................ 357/72 |
| 5,298,739 A | 3/1994 | Hiroki et al. ............. 250/227.11 |
| 5,304,794 A | 4/1994 | Malone et al. ............. 250/214 R |
| 5,313,138 A * | 5/1994 | Desmur ........................ 315/3 |

(Continued)

FOREIGN PATENT DOCUMENTS

| DE | 1 299 087 | 7/1969 |
| DE | 41 36 690 C2 | 5/1993 |

(Continued)

OTHER PUBLICATIONS

"Optical Control of GaAs MESFET's", De Salles, IEEE Transactions on Microwave Theory and Techniques, vol. MTT-31, No. 10, Oct. 1983, pp. 812-820.

(Continued)

*Primary Examiner* — Victor A Mandala
*Assistant Examiner* — William Harriston
(74) *Attorney, Agent, or Firm* — Marshall, Gerstein & Borun LLP

(57) ABSTRACT

An electronic switching component (1) with gallium arsenide-based field effect transistors has its own housing (2) with at least one transparent section (3). An electronic microwave circuit (10) has at least one electronic switching component (1) with gallium arsenide-based field effect transistors and its own housing (2) with at least one transparent section (3). The at least one electronic switching component (1) can be illuminated by means of at least one light source (6, 11).

16 Claims, 4 Drawing Sheets

(56) References Cited

U.S. PATENT DOCUMENTS

| | | | |
|---|---|---|---|
| 5,623,233 A | 4/1997 | Higgins et al. | 331/37 |
| 6,420,205 B1 | 7/2002 | Sawai | 438/65 |
| 6,440,778 B1 | 8/2002 | Okada et al. | 438/121 |
| 6,876,271 B2 * | 4/2005 | Evers et al. | 333/81 A |
| 6,945,712 B1 * | 9/2005 | Conn | 385/94 |
| 2003/0223705 A1 * | 12/2003 | Hill et al. | 385/92 |
| 2004/0036462 A1 * | 2/2004 | Evers et al. | 323/369 |

FOREIGN PATENT DOCUMENTS

| | | |
|---|---|---|
| DE | 295 04 789.5 | 6/1995 |
| DE | 692 18 040 T2 | 7/1997 |
| DE | 102 28 810 A1 | 1/2004 |
| EP | 348 361 | 12/1989 |
| GB | 1167063 | 10/1969 |
| JP | 2001102489 A | 4/2001 |

OTHER PUBLICATIONS

"Analysis of Optically Controlled Microwave/Millimeter-Wave Device Structures", Simons, IEEE Transactions on Microwave Theory and Techniques MTT-34, Dec. 1986, pp. 1349-1355.

"Photovoltaic-FET for Optoelectronic RF/µwave Switching", Sun et al., IEEE Transactions on Microwave Theory and Techniques, vol. 44, No. 10, Oct. 1996, pp. 1747-1750.

International Search Report in PCT/EP2005/004332 dated May 29, 2006.

* cited by examiner

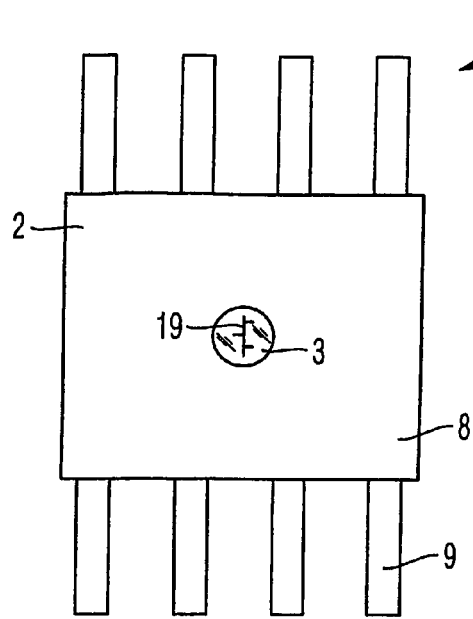
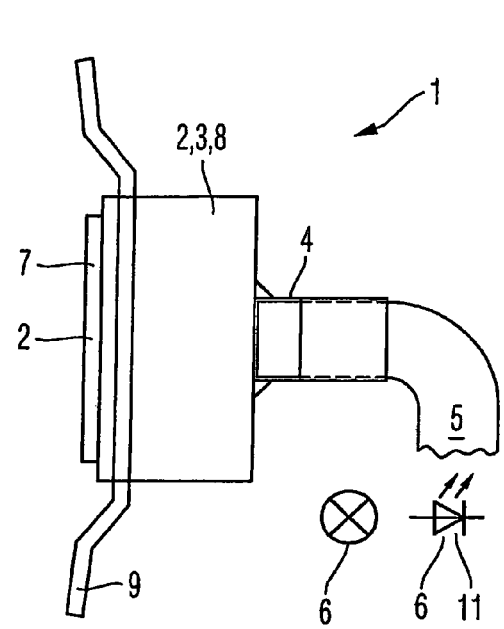
Fig. 3     Fig. 4
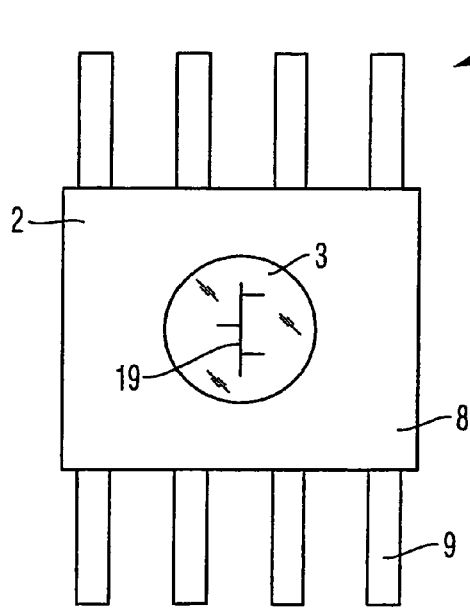
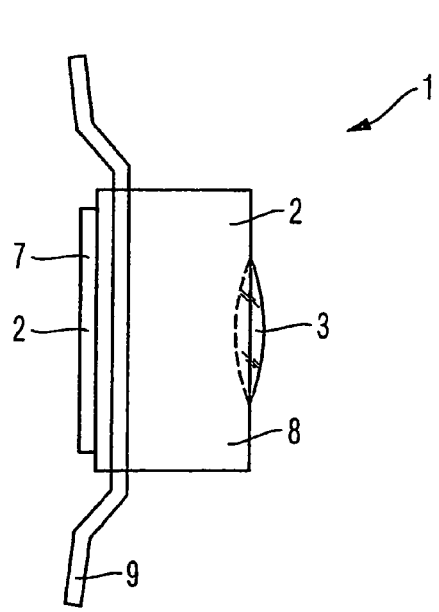
Fig. 5     Fig. 6

ILLUMINABLE GAAS SWITCHING COMPONENT WITH TRANSPARENT HOUSING AND ASSOCIATED MICROWAVE CIRCUIT

BACKGROUND OF THE INVENTION

1. Field of the Invention

The invention relates to an electronic-switching component with field-effect transistors on a gallium-arsenide-based substrate, which is used especially but not exclusively for rapid switching of high-frequency signals in microwave attenuation circuits, and which can be irradiated by a light source, wherein the light irradiating the field-effect transistors can substantially shorten the switching times of the field-effect transistors and/or of the electronic-switching component.

2. Related Technology

It is already known that field-effect transistors can be used very readily on a semiconductor chip. Moreover, they require only very little control power. One consequence of illuminating gallium-arsenide-based field-effect transistors, especially MESFETs, is that imperfections occurring at the semiconductor junctions especially below the gate electrode, which have a negative influence on the switching times of the field-effect transistors, are recharged more rapidly. The negative influence of imperfections in MESFET components is known as the gate-lag effect and can be measured as an extremely slow change in the bulk resistance. This is caused by the slow charging and discharging of the surface imperfections of the source-gate path and the gate-drain path. Illuminating the field-effect transistors generates electron-hole pairs, which neutralise the charges trapped in the imperfections. Illumination can be used to suppress the gate-lag effect and to shorten the switching time by a factor of 10-100.

High-frequency circuits, such as microwave circuits, which are designed as attenuation circuits, can be used, for example, in high-frequency technology for measuring purposes, for example, for controlling the level of signal generators and network analysers. For example, in order to implement measurement series with different variable parameters rapidly, the attenuation circuits and/or the switching components used in them must be able to switch very rapidly and must provide a very wide dynamic range. Circuits with gallium-arsenide-based field-effect transistors, which, in more recent switching arrangements, can be additionally illuminated, are used in this context especially in order to achieve a further shortening of the switching-time, in particular, because of their excellent high-frequency compatibility and their very-short switching times.

DE 102 28 810 A1 discloses a generic microwave circuit. The digitally-controllable attenuation element disclosed in this document is built up with field-effect transistors as the switching elements, which can be illuminated, for example, by an LED. In this context, the circuit of field-effect transistors is built up on an un-housed, gallium-arsenide semiconductor chip, wherein the semiconductor chip is attached to a substrate using a costly and difficult hybrid technique and connected to the substrate by electrical connections. The semiconductor chip does not have its own, dedicated housing, because the light from the light source must irradiate the field-effect transistors. Accordingly, the microwave circuit disclosed in the named document is enclosed in a cost-intensive manner within an air-tight housing.

The disadvantage with the electronic-switching component with field-effect transistors on a gallium-arsenide-based substrate disclosed in DE 102 28 810 A1 is that a difficult, cost-intensive and sensitive assembly technique, a so-called hybrid technique, must be used to attach and contact the switching component in a circuit, because the switching component does not have its own housing, which provides, for example, its own contact terminals (pins) leading to the outside. Moreover, in order to protect the sensitive, open switching component and/or the semiconductor junctions or metal-semiconductor junctions from environmental influences and dust particles, which can, for example, cause shadows at a semi-conductor junction, the switching component and the substrate, to which the switching component is attached, is surrounded by a large-volume, air-tight and correspondingly cost-intensive housing.

GENERAL DESCRIPTION OF THE INVENTION

The invention therefore provides an electronic-switching component with field-effect transistors on a gallium-arsenide-based substrate, which is more reliable, less susceptible to error, more cost favorable in manufacture and assembly and less sensitive by comparison with the prior art, wherein the field-effect transistors can be illuminated especially in order to accelerate switching. Furthermore, the invention provides a microwave circuit, which is structured in a simpler and more cost-favorable manner, and which avoids the disadvantages of the prior art.

According to the invention, the electronic-switching component is enclosed within a dedicated housing, which provides at least one transparent portion, wherein the transparent portion is disposed in such a manner that light from outside the dedicated housing can irradiate or be directed onto the field-effect transistors.

According to one further development of the invention, the field-effect transistors are designed in the form of MESFETs (metal-semiconductor-FETs), which use a metal-semiconductor junction without oxide as the gate-channel junction, especially in the form of GaAs MESFETs, which are built up on a gallium-arsenide substrate. These are known for their excellent high-frequency properties.

According to another further development, the dedicated housing of the switching component provides a retaining device for one end of an optical waveguide and/or a light source. As a result, the assembly of the optical waveguide and/or the light source can be substantially simplified and the orientation the light source and/or of the end of the optical waveguide relative to the switching component can be achieved in a substantially simpler and more accurate manner. Fluctuations in luminous intensity resulting from assembly tolerances can therefore be largely avoided.

In another further development, the retaining device is designed in such a manner that only light emitted by the light source arranged in the retaining device and/or light from the end of the optical waveguide accommodated in the retaining device passes through the transparent portion onto the field-effect transistors. As a result, it is possible to avoid, in particular, any potential, unintended fluctuations in luminous intensity caused by external light, which does not originate from the light sources allocated in each case to the respective switching components.

The design of the electronic-switching component according to the invention as a surface-mounted component (SMD) improves ease of assembly.

The transparent portion advantageously consists of a transparent material, wherein the transparent material especially deflects and/or concentrates the light from the light source onto the field-effect transistors through its shape. Accordingly, the luminous intensity on the field-effect transistors can be increased with the same power. Moreover, the position of the light source and/or of the end of the optical waveguide relative to the transparent portion can be designed to be more variable, and the field-effect transistors are protected from contamination and environmental influences in an improved manner.

The dedicated housing of the electronic-switching component according to the invention is advantageously designed in two parts. The manufacture of a housing, which is transparent only in certain portions, can be simplified, for example, in this manner, wherein it is particularly advantageous to manufacture the housing from at least one first housing component forming a lower housing component and a second housing component forming an upper housing component. The manufacture of the housing can be further simplified with a completely transparent second housing component.

If the first housing component comprises a ceramic material, the dielectric properties of the housing, which are important for high-frequency technology, can be preserved.

If the first housing component comprises a metallic material, waste heat can be removed from the housing in an improved manner.

The light source of the electronic-microwave circuit according to the invention is advantageously formed by a halogen, xenon and/or gas-discharge lamp and/or laser, because these allow high luminous-intensity levels and good lighting efficiency at the same time as providing low power losses and/or waste heat.

The design of the light source as a light-emitting diode (LED) is advantageous, because LEDs have a very long operating life with a low-loss factor and low cost.

The design of the light source and/or the light-emitting diode as a surface-mounted device (SMD) improves ease of assembly.

In another further development, at least one switching component is disposed in a housing compartment, which is sealed with regard to external light. Unintended fluctuations in luminous intensity can be avoided as a result.

By means of light-reflecting walls in the housing compartment, which deflect and/or reflect the light emitted by the light source within the housing compartment in the direction towards the transparent portion, the luminous intensity in the transparent portion can be increased simply and without additional electrical power. Moreover, the positioning of the light source and/or of the end of an optical waveguide relative to the electronic-switching component can be selected more freely.

Furthermore, it is advantageous if the light source is disposed outside the housing compartment, and the light is conducted into the housing compartment by means of an optical waveguide. As a result, the light source can be mounted remote from the switching component. In this manner, the positioning of the light source can be selected in a more flexible manner. The power loss from the light source can therefore no longer influence the switching component. This also achieves a considerable improvement in ease of assembly.

The light source is advantageously arranged in such a manner that it can illuminate at least two switching components. This simplifies the electronic-microwave circuit.

If the light source and the switching component are mounted on a shared carrier, such as a shared printed-circuit board, this allows a further simplification in the structure of the microwave circuit.

BRIEF DESCRIPTION OF THE DRAWINGS

The invention is explained in greater detail below with reference to schematic drawings. In this context, identical components are shown with identical reference numbers. The drawings are as follows:

FIG. 3 shows a schematic illustration of a switching component according to the invention corresponding to a second exemplary embodiment in plan view;

FIG. 4 shows a schematic illustration of a switching component according to the invention with a retaining device corresponding to a third exemplary embodiment in a lateral view;

FIG. 5 shows a schematic illustration of a switching component according to the invention corresponding to a fourth exemplary embodiment in plan view;

FIG. 6 shows a schematic illustration of a fourth exemplary embodiment in a lateral view;

DETAILED DESCRIPTION

Figure 1:
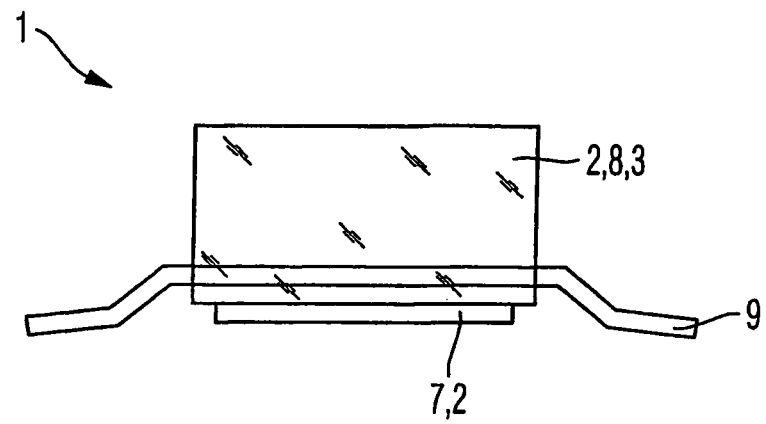
FIG. 1 shows a schematic illustration of a switching component according to the invention corresponding to a first exemplary embodiment of the invention in a lateral view.

FIG. 1 shows a lateral view of a first exemplary embodiment according to the invention of an electronic-switching component 1. The electronic-switching component 1 has a dedicated housing 2 with, for example, eight contact terminals and/or pins 9, which are disposed on mutually-opposite sides of the rectangular housing 2.

Figure 2:
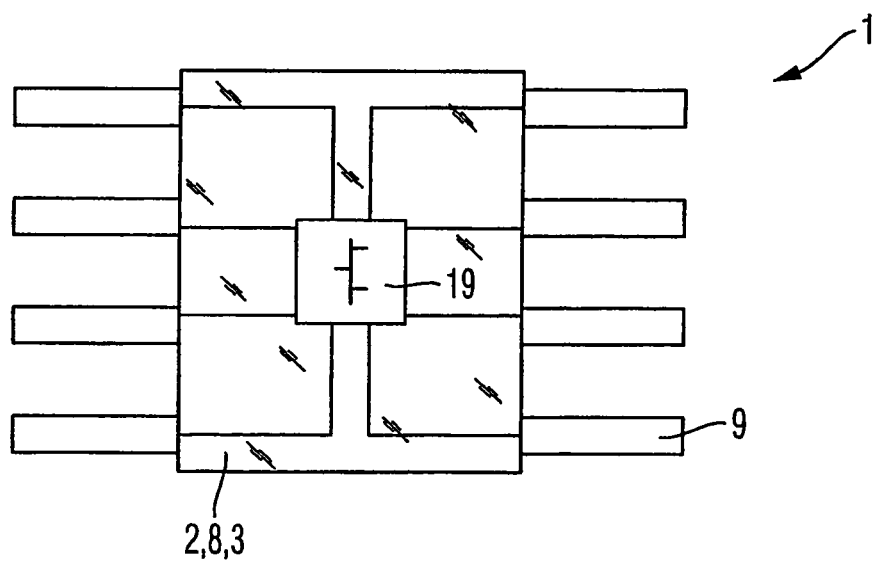
FIG. 2 shows a schematic illustration of a first exemplary embodiment in plan view.

A circuit 19 with GaAs field-effect transistors (GaAs-FETs) for the switching of electronic signals, illustrated schematically in FIG. 2, is disposed in the interior of the housing 2. In the exemplary embodiment illustrated, the housing 2 is designed in two parts and consists of a first housing component 7, which is designed as a lower housing component 7, and a second housing component 8, which is designed as an upper housing component 8. The pins 9 pass laterally into the first housing component 7 contacting the circuit with the GaAs field-effect transistors in the interior of the housing 2. In this context, the circuit 19 with GaAs field-effect transistors is firmly connected, for example, to the first housing component 7. The first housing component 7 in the illustrated exemplary embodiment consists of an opaque ceramic material with very small dielectric constant.

In the illustrated exemplary embodiment, the second housing component 8 consists entirely of a light-permeable, transparent synthetic material, wherein the entire second housing component 8 forms a transparent portion 3, through which the GaAs field-effect transistors of the circuit 19 can be irradiated with light by means of a light source, which is not illustrated. Acrylic glass and polymethylmethacrylate (PMMA) are particularly suitable as a transparent synthetic material.

FIG. 2 shows a schematic illustration of the first exemplary embodiment in plan view. The circuit 19 with the GaAs field-effect transistors (GaAs-FET) for switching electronic signals can be seen in the interior of the housing 2 through the second housing component 8, which forms the transparent portion 3. In the exemplary embodiment illustrated, the circuit 19 is attached to the first housing component 7. In other exemplary embodiments, the first housing component 7 can consist at least partially of a metal or metal alloy, which is a good thermal conductor.

FIG. 3 shows a schematic illustration of the switching component 1 according to the invention corresponding to a second exemplary embodiment in plan view. In this exemplary embodiment, the second housing component 8, which is shown from above, is made of an opaque material, preferably of the same material as the first housing component 7, which is not shown in this drawing. In different exemplary embodiments, the housing 2 formed by the two housing components 7 and 8 can also be formed in one part, for example, using an injection moulding method. The second housing component 8 formed in this exemplary embodiment by the upper housing component 8 is opaque apart from a transparent portion 3. The first housing component 7 formed in this exemplary embodiment by the lower housing component 7, which is not illustrated, is designed to be opaque. The circuit 19 with the GaAs-FETs and/or the GaAs-FETs themselves can be irradiated with light through the circular, transparent portion 3 arranged in this exemplary embodiment in the centre of the upper side of the second housing component 8. As already mentioned in the introduction to the present description, the switching times of the GaAs-FETs can be considerably reduced as a result.

The transparent portion 3 can be designed as a simple, clear opening or can be made of a transparent solid material, such as glass and/or a synthetic material designed to be transparent.

FIG. 4 shows a schematic illustration of the switching component 1 according to the invention with a retaining device 4 corresponding to a third exemplary embodiment in a lateral view. On the upper side of the second housing component 8, the housing 2, corresponding in its outer form to the housing 2 from FIG. 1, additionally provides the retaining device 4 for retaining one end of an optical waveguide 5 and/or a light source 6. The retaining device 4 is designed in the shape of a hollow cylinder and, with its open end facing towards the upper side of the second housing component 8, completely encloses the transparent portion 3 designed and disposed as in FIG. 3. The retaining device 4 is either designed in one-piece with the housing 2, for example, by means of a fusion, casting and/or injection method, or is connected to the housing 2 by means of a material-connection method. In the exemplary embodiment illustrated, the retaining device 4 is designed in such a manner, and one end of the optical waveguide 5 is introduced into the retaining device 4 in such a manner that no other light apart from the light emitted from the optical waveguide 5 can pass through the transparent portion 3.

In the exemplary embodiment, the electronic-switching component 1 is designed as a so-called surface-mounted component (SMD).

FIG. 5 shows a schematic illustration of a switching component 1 according to the invention corresponding to a fourth exemplary embodiment in plan view. In the exemplary embodiment illustrated, the transparent portion 3 consists of a transparent synthetic material or glass with optical properties, which correspond to those of a collecting lens, in order to concentrate the incident light. The transparent portion 3 is disposed in the upper housing component 8, but, in other exemplary embodiments, can also be disposed, for example, in the lower housing component 7. If the transparent portion 3 is to be kept small, and at the same time, a large area of the circuit 19 with the GaAs-FETs is to be illuminated, then a dispersing lens can also be used.

FIG. 6 shows a schematic illustration of the fourth exemplary embodiment in a lateral view. The transparent portion 3, which is designed as a collecting lens, and the two-part design of the housing 2 are clearly evident.

Figure 7:
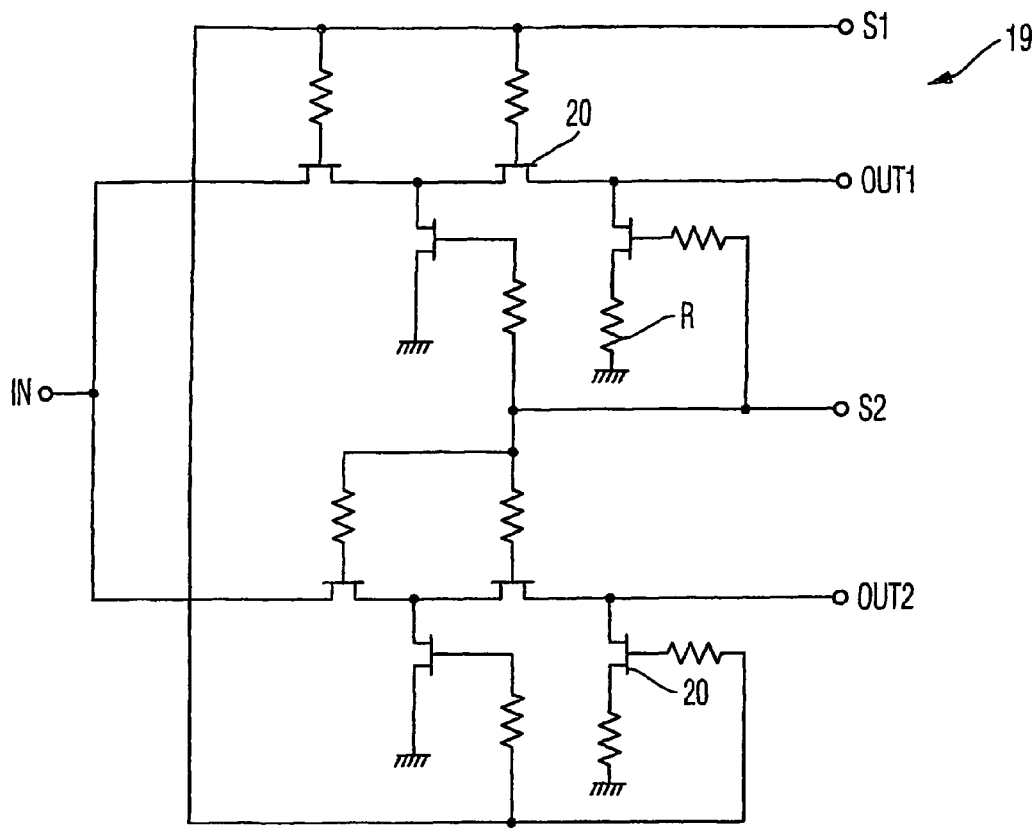
FIG. 7 shows an embodiment of the circuit with GaAs field-effect transistors of the switching component according to the invention.

FIG. 7 shows an embodiment of the circuit 19 with GaAs field-effect transistors of the switching components 1 according to the invention. The circuit 19 comprises several GaAs field-effect transistors 20, a high-frequency input IN, a first high-frequency output OUT 1, a second high-frequency output OUT 2, a first control connection S1, a second control connection S2 and several resistors R. If a high-frequency electrical signal is connected to the high-frequency input IN, it is possible to switch between the two high-frequency outputs OUT 1 and OUT 2 by selecting the electrical voltages at the two control connections S1 and S2 in such a manner that the high-frequency input signal is output with only a slight attenuation at one of the high-frequency outputs OUT 1 or OUT 2 respectively. In the exemplary embodiment illustrated, the respective high-frequency output OUT 1, OUT 2, which is not emitting the high-frequency input signal, is electrically insulated from the input and at the same time terminated with a termination, for example, of 50 Ω.

For instance, the high-frequency signal disposed at the high-frequency input IN is connected with a voltage of 0 Volt at the first control connection S1 and a voltage of −5 Volts at the second control connection S2, with only a low attenuation through the GaAs field-effect transistors 20 to the first high-frequency output OUT 1. When the two control voltages are switched, the high-frequency input signal is connected respectively to the other high-frequency output OUT 1, OUT 2.

Figures 8, 9:
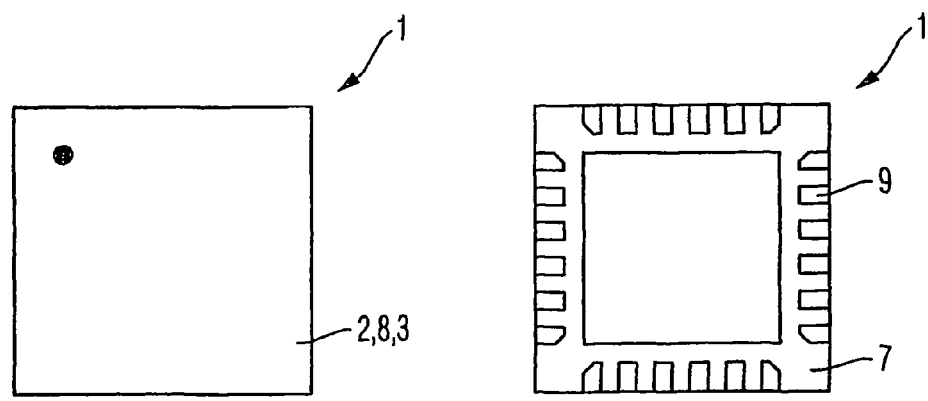
FIG. 8 shows a schematic illustration of a switching component according to the invention corresponding to a fifth exemplary embodiment in plan view.
FIG. 9 shows a schematic illustration of the fifth exemplary embodiment in a view from below.

FIG. 8 shows a schematic illustration of a switching component 1 according to the invention corresponding to a fifth exemplary embodiment in plan view. The fifth exemplary embodiment has a square, two-part housing 2. The second housing component 8 shown from above in the illustration is made entirely of a synthetic material designed to be transparent, but may also consist, for example, of glass.

FIG. 9 shows a schematic illustration of the fifth exemplary embodiment in a view from below. The first housing component 7 viewed from below in the drawing, which forms the lower housing component 7, provides pins 9 distributed uniformly on all four sides. The square area disposed in the centre of the pins 9 is made, for example, of an opaque ceramic material and/or a metallic material. The electronic-switching component 1 is suitable for assembly using SMD technology.

Figure 10:
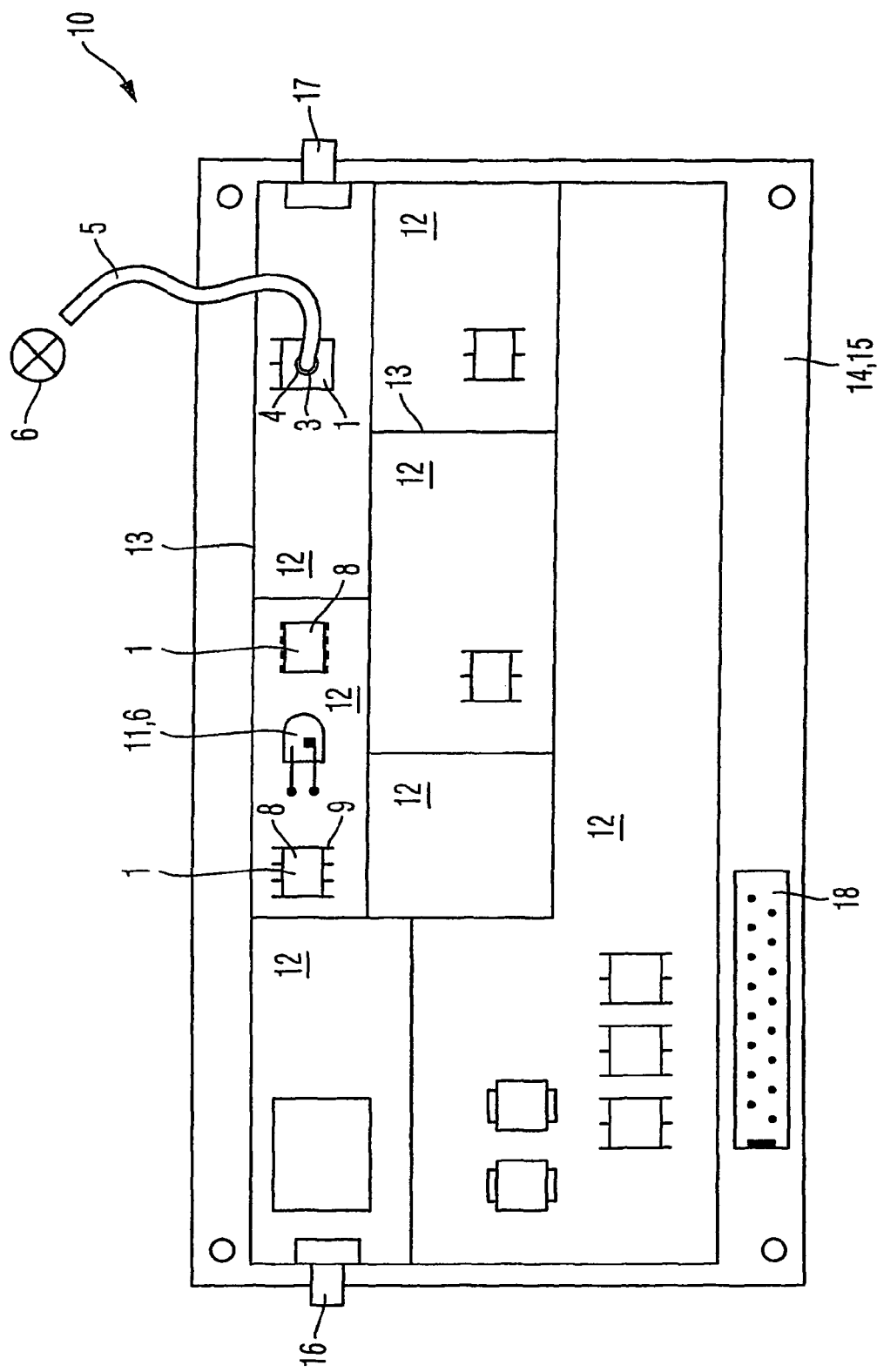
FIG. 10 shows the schematic structure of a microwave circuit according to the invention in a sixth exemplary embodiment of the invention.

FIG. 10 shows a schematic illustration of the structure of a microwave circuit 10 according to the invention corresponding to an exemplary embodiment of the invention. The microwave circuit comprises a carrier 14 designed as a printed-circuit board 15 and several housing compartments 12, which are light-tight relative to the outside, and which are attached to the carrier 14. The housing compartments 12 are used especially for shielding high-frequency electromagnetic radiation. In the exemplary embodiment illustrated, illuminable electronic-switching components 1 are mounted, preferably using surface mount device (SMD) technology, on the printed-circuit board 15 in some of the housing compartments 12 disposed between a high-frequency input 16 and a high-frequency output 17. In the illustrated exemplary embodiment, two switching components 1 and one light source 6 are disposed in one of the housing compartments 12. The light source 6 is designed in the form of a light-emitting diode (LED) 11, which can also be designed as an SMD and is disposed centrally between the two switching components 1. Accordingly, the LED 11 can illuminate two switching components 1 at the same time. In order to deflect as much light as possible into the transparent portion 3 of the switching components 1, the walls 13 of the housing compartments 12 are designed to be strongly light reflective. In the illustrated exemplary embodiment, the walls 13 are made of polished metal, especially steel sheet. In the housing compartment 12 illuminated by the LED, both of the switching components 1 are formed according to the first exemplary embodiment from FIG. 1 and FIG. 2 and therefore each provide a second housing component 8, which consists entirely of a transparent material.

According to an alternative embodiment, a single switching component 1, which provides a retaining device 4 for one end of an optical waveguide 5, is arranged in the housing compartment 12 disposed at the high-frequency output 17. The optical waveguide 5 is guided in a light-tight manner through the wall 13 of the housing compartment 12 disposed at the high-frequency output 17 and is also guided in a light-tight manner into the retaining device 4. Since the relevant electronic-switching component 1 arranged at the high-frequency output 17 is designed as shown in FIG. 4, only the light guided through the optical waveguide 5 passes through the transparent portion 3 of the switching component 1. The at least one light source 6 supplying the optical waveguide 5 with light is arranged outside the housing compartment 12 disposed at the high-frequency output 17, and can be mounted on the carrier 14 and formed, for example, by an LED, a xenon, halogen and/or gas-discharge lamp.

In other exemplary embodiments, one end of the optical waveguide 5 guided into the housing compartment 12 can also illuminate several switching components 1.

The wavelength range of the light source 6 or respectively of the LED 11 is not restricted to the visible range and includes especially the ultraviolet and infrared wavelength ranges and/or colour ranges or parts thereof. The light source 6 can especially emit light in the colours red, green, blue, white and orange, wherein, especially when using LEDs 11, combinations of the named colours, and/or wavelength ranges are possible using only one LED 11 or several LEDs 11.

The light source 6 can be disposed on the same carrier 14 with the respective electronic-switching component 1 allocated to the latter or, for example, on a housing cover, which closes the housing compartments 12 at the top, but which is not illustrated. In exactly the same manner, the optical waveguide 5 can engage through this housing cover, which is not illustrated.

The microwave circuit is designed in the form of an attenuation circuit. In this context, a signal disposed at the high-frequency input 16, is connected with various attenuations through to the high-frequency output 17, wherein, via a control connection 18, the attenuation values are adjusted, and the light sources 6 are optionally controlled.

In other exemplary embodiments, which are not illustrated, both the upper housing component 8 and the lower housing component 7 can be designed to be transparent and/or the housing 2 can be designed in one part to be completely transparent.

The invention is not restricted to the exemplary embodiments. The features of the exemplary embodiments can be combined with one another in any manner required.

The invention claimed is:

1. Electronic-switching component with gallium-arsenide-based field-effect transistors and a dedicated housing, said dedicated housing providing at least one transparent portion,
   the housing further comprising at least one retaining device accommodating at least one of one end of an optical waveguide and an LED-light source, and a housing compartment having internal light-reflecting walls, wherein the wavelength range of the LED-light source is in the infrared wavelength range,
   the retaining device being unitary with the housing,
   wherein the transparent portion of the housing comprises optical properties corresponding to those of a dispersive lens, and
   wherein the transparent portion is adapted to illuminate a surface of a substrate containing the field-effect transistors via the dispersive lens to generate electron-hole pairs to neutralize charges trapped in surface imperfections of the gallium-arsenide based field-effect transistors to accelerate switching.

2. Electronic-switching component according to claim 1, wherein the field-effect transistors are GaAs-MESFETs.

3. Electronic-switching component of claim 1, wherein the light from the light source or from the end of the optical waveguide passes through the transparent portion onto the field-effect transistors.

4. Electronic-switching component of claim 1, wherein the electronic-switching component is a surface-mounted component.

5. Electronic-switching component of claim 1, wherein the transparent portion comprises a transparent material.

6. Electronic-switching component of claim 5, wherein the transparent material deflects the light onto the field-effect transistors by means of the shape of the transparent material.

7. Electronic-switching component of claim 5, wherein the transparent material comprises glass.

8. Electronic-switching component of claim 5, wherein the transparent material comprises at least one synthetic material.

9. Electronic-switching component of claim 8, wherein the synthetic material is selected from the group consisting of transparent silicon, polyamide, polycarbonate, polyester, polyvinylacetate, polyethylene, polypropylene, polyvinylchloride, polymethylmethacrylate, acrylic glass, and polystyrene.

10. Electronic-switching component of claim 1, wherein the housing comprises at least two parts with at least one first housing component and a second housing component.

11. Electronic-switching component of claim 10, wherein the first housing component forms a lower housing component facing a carrier to which the electronic-switching component is attached, and the second housing component forms an upper housing component disposed opposite to the lower housing component.

12. Electronic-switching component of claim 10, wherein the entire second housing component is transparent.

13. Electronic-switching component of claim 10, wherein the first housing component is opaque and comprises a ceramic material.

14. Electronic-switching component of claim 10, wherein the first housing component is opaque and comprises a metallic material.

15. Electronic-microwave circuit of claim 1, wherein the light source is disposed outside the otherwise light-tight housing compartment.

16. Electronic-microwave circuit of claim 15, wherein the light of the light source is guided into the housing compartment through an optical waveguide.

\* \* \* \* \*